United States Patent
Park

(10) Patent No.: US 10,211,651 B2
(45) Date of Patent: Feb. 19, 2019

(54) DEVICE AND METHOD FOR MANAGING SOC AND SOH OF PARALLEL-CONNECTED BATTERY PACK

(71) Applicant: LG CHEM, LTD., Seoul (KR)

(72) Inventor: Mi So Park, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/712,895

(22) Filed: Sep. 22, 2017

(65) Prior Publication Data

US 2018/0090948 A1 Mar. 29, 2018

(30) Foreign Application Priority Data

Sep. 23, 2016 (KR) .................. 10-2016-0122195

(51) Int. Cl.
*H02J 7/00* (2006.01)
*H02J 7/34* (2006.01)
*H01M 10/42* (2006.01)
*G01R 31/36* (2006.01)
*H01M 10/48* (2006.01)

(52) U.S. Cl.
CPC ........ *H02J 7/0021* (2013.01); *G01R 31/3606* (2013.01); *H01M 10/4207* (2013.01); *H01M 10/482* (2013.01); *H02J 7/34* (2013.01)

(58) Field of Classification Search
CPC ...... H02J 7/0021; H02J 7/34; G01R 31/3606; H01M 10/4207; H01M 10/482

USPC .................................................. 320/126, 134
See application file for complete search history.

(56) References Cited

U.S. PATENT DOCUMENTS

| 2010/0244781 | A1* | 9/2010 | Kramer | H02J 7/0016 320/162 |
| 2012/0187907 | A1* | 7/2012 | Nysen | H01M 10/052 320/116 |
| 2016/0254683 | A1* | 9/2016 | Matsumoto | H02J 7/0014 320/118 |

FOREIGN PATENT DOCUMENTS

| JP | 2004031123 A | * | 1/2004 | ............. G01R 31/36 |
| JP | 2013513809 A | * | 4/2013 | ............. G01R 31/36 |
| KR | 20120096278 A | * | 8/2012 | ............ G01R 31/362 |
| KR | 20160146032 A | * | 12/2016 | ......... G01R 31/3658 |

OTHER PUBLICATIONS

KIPO Search Report dated Oct. 15, 2018, 2 pages.*

* cited by examiner

*Primary Examiner* — Nathaniel R Pelton
(74) *Attorney, Agent, or Firm* — Lerner, David, Littenberg, Krumholz & Mentlik, LLP

(57) ABSTRACT

Provided is method of controlling an SOC value and an SOH value of an entire battery pack system in which two or more battery packs are connected in parallel. The method includes: an individual SOC value and SOH value calculation operation for calculating the SOC value and the SOH value of each of the two or more battery packs connected in parallel.

6 Claims, 4 Drawing Sheets

DEVICE AND METHOD FOR MANAGING SOC AND SOH OF PARALLEL-CONNECTED BATTERY PACK

CROSS-REFERENCE TO RELATED APPLICATION

This application claims priority to Korean Patent Application No. 10-2016-0122195 filed on Sep. 23, 2016 and all the benefits accruing therefrom under 35 U.S.C. § 119, the contents of which are incorporated by reference in their entirety.

BACKGROUND

The present disclosure relates to a device and method for controlling the SOC and SOH of an entire battery pack system in which two or more battery packs are connected in parallel.

More particularly, the present disclosure relates to preventing a sudden change in the SOC and the SOH of an entire system of a battery pack in which two or more battery packs are connected in parallel, and using the entire system of the battery pack in a safe range.

In recent years, as demand for portable electronic products such as notebook computers, video cameras, and portable telephones is rapidly increased and development of batteries for storage, robots, and satellites for energy storage is accelerated, studies on high performance secondary batteries capable of repeating charge and discharge have been actively conducted.

There are currently commercialized secondary batteries including nickel-cadmium batteries, nickel-metal hydride batteries, nickel-zinc batteries, and lithium secondary batteries. Among them, the lithium secondary batteries receive a lot of spotlight due to its advantages of being free from charge and discharge, very low self-discharge rate, and high energy density because the memory effect hardly occurs compared with the nickel-based secondary battery.

On the other hand, as carbon energy is gradually depleted and environmental concerns are rising, demand for hybrid cars and electric vehicles is increasing worldwide, including the US, Europe, Japan, and Korea. Since these hybrid vehicles and electric vehicles use the charge and discharge energy of a battery pack to obtain the vehicle driving power, they are more fuel-efficient than the vehicles using only the engine and do not discharge or reduce pollutants. Therefore, they are getting good responses from many consumers. Therefore, more attention and research are focused on automotive batteries, which are key components of hybrid vehicles and electric vehicles.

Recently, energy storage technology such as smart grid system is also one of the most popular technologies. The smart grid system is an intelligent grid system that aims to increase the efficiency of power utilization through the interaction of power supply and consumption by integrating information and communication technology into the production, transportation and consumption process of electric power. One of the important components to build such a smart grid system is a battery pack that stores power.

In such a way, the battery is used in various fields. In recent years, a field where a battery is heavily used, such as an electric vehicle, a hybrid vehicle, and a smart grid system, often requires a large capacity. In order to increase the capacity of the battery pack, there may be a method of increasing the capacity of a single battery pack itself. However, in this case, there is a disadvantage that the capacity increase effect is not large and there is a physical restriction on the size expansion of the battery pack and there is inconvenience in management. Therefore, a method of constructing a high capacity battery system by connecting a plurality of battery packs in parallel is commonly used.

However, when the battery packs are connected in parallel as described above, if the state of charge (SOC) between the battery packs is different from each other, electrical sparks may occur. Especially, in the case of a lithium secondary battery which is widely used in recent years, since the discharge current is very high as compared with other batteries, when battery packs with a different SOC are connected in parallel, it is possible to damage the battery cells and various circuits included in the battery pack. Also, there is a concern that it is possible to reduce the safety of a user (installer) who connects the battery packs due to the occurrence of spark.

In addition, even after a plurality of battery packs are connected in parallel, there may be a case in which the storage capacity of the battery pack is increased or a part of the battery pack is damaged and needs to be replaced. At this time, one or more battery packs should be additionally connected to the plurality of battery packs connected in parallel. In this situation, the additional connected battery pack may have a different SOC from the battery packs connected in parallel. At this time, electrical sparks may be generated to cause a problem in safety of the user and also may cause a problem of damaging battery pack cells or various circuit components.

SUMMARY

The present disclosure provides a device and method for controlling the SOC and SOH of a battery pack system in which two or more battery packs are connected in parallel.

The present disclosure also provides a device and method for measuring the SOC and SOH of each battery pack and setting it to a relaxed value in the entire battery pack system in order to prevent sudden changes in SOC and SOH values of the battery pack system and allow the battery pack system to be used within a safe range.

In accordance with an exemplary embodiment, provided is a method of controlling an SOC value and an SOH value of an entire battery pack system in which two or more battery packs are connected in parallel. The method includes: an individual SOC value and SOH value calculation operation for calculating the SOC value and the SOH value of each of the two or more battery packs connected in parallel; a maximum/minimum/average value detection operation for detecting a maximum SOC value, a minimum SOC value, a maximum SOH value, a minimum SOH value, an average SOC value, and an average SOH value among the values calculated in the individual SOC value and SOH value calculation operation; a temporary SOC value and SOH value setting operation for setting a temporary SOC value and a temporary SOH value by comparing the values detected by the maximum/minimum/average value detection operation with a predetermined SOC tolerance value and SOH tolerance value of the entire battery pack system in which two or more battery packs are connected in parallel; a counting operation for counting the number of times of the temporary SOC value and the SOH value setting performance period configured in the temporary SOC value and SOH value setting operation; and a system SOC value and SOH value changing operation for if the number of times of the temporary SOC value and the SOH value setting performance period counted in the counting operation is greater than a predetermined value, resetting the counting number and changing the SOC value and the SOH value of the entire battery pack system in which two or more battery packs are connected in parallel, based on the temporary SOC value and SOH value set in the temporary SOC value and SOH value setting operation, wherein the system SOC value and SOH value changing operation further includes, if the number of temporary SOC value and the SOH value setting performance period counted in the counting operation is less than a predetermined value, an operation for returning to the individual SOC value and SOH value calculation operation and performing the temporary SOC value and SOH value setting performance period again; and a difference value calculation operation for calculating a difference value between the temporary SOC value and the temporary SOH value set in the temporary SOC value and SOH value setting operation and the current system SOC value and SOH value of the entire battery pack system in which two or more battery packs are connected in parallel, wherein if the difference value calculated in the difference value calculation operation is within a predetermined range, the temporary SOC value and the temporary SOH value set in the temporary SOC value and SOH value setting operation are set as the SOC value and the SOH value of the entire battery pack system in which two or more battery packs are connected in parallel; and if the calculated difference value is out of the predetermined range, the current system SOC value and SOH value of the entire battery pack system in which two or more battery packs are connected in parallel are changed by a predetermined value in a direction in which the difference value is deceased, and the changed system SOC value and SOH value are set as the current system SOC value and SOH value of the entire battery pack system in which two or more battery packs are connected in parallel.

The temporary SOC value and SOH value setting operation may include: a maximum tolerance value comparison operation for comparing the maximum SOC value and the maximum SOH value detected by the maximum/minimum/average value detection operation with the predetermined SOC maximum tolerance value and SOH maximum tolerance value of the entire battery pack system in which two or more battery packs are connected in parallel; and a minimum tolerance value comparison operation for comparing the minimum SOC value and the minimum SOH value detected by the maximum/minimum/average value detection operation with the predetermined SOC minimum tolerance value and SOH minimum tolerance value of the entire battery pack system in which two or more battery packs are connected in parallel.

The maximum tolerance value comparison operation may set the maximum SOC value and the maximum SOH value detected by the maximum/minimum/average value detection operation as a temporary SOC value and a temporary SOH value if the maximum SOC value and the maximum SOH value detected by the maximum/minimum/average value detection operation are greater than the predetermined SOC maximum tolerance value and SOH maximum tolerance value of the entire battery pack system in which two or more battery packs are connected in parallel, and perform the minimum tolerance value comparison operation if the maximum SOC value and the maximum SOH value detected by the maximum/minimum/average value detection operation are less than the predetermined SOC maximum tolerance value and SOH maximum tolerance value of the entire battery pack system in which two or more battery packs are connected in parallel.

The minimum tolerance value comparison operation may set the minimum SOC value and the minimum SOH value detected by the maximum/minimum/average value detection operation as a temporary SOC value and a temporary SOH value if the minimum SOC value and the minimum SOH value detected by the maximum/minimum/average value detection operation are less than the predetermined SOC minimum tolerance value and SOH minimum value of the entire battery pack system in which two or more battery packs are connected in parallel, and set the average SOC value and the average SOH value detected by the maximum/minimum/average value detection operation as a temporary SOC value and a temporary SOH value if the minimum SOC value and the minimum SOH value detected by the maximum/minimum/average value detection operation are greater than the predetermined SOC minimum tolerance value and SOH minimum value of the entire battery pack system in which two or more battery packs are connected in parallel.

In accordance with yet another exemplary embodiment, provided is a device for controlling an SOC value and an SOH value of an entire battery pack system in which two or more battery packs are connected in parallel, the device including: an individual SOC value and SOH value calculation unit configured to calculate an SOC value and an SOH value of each of two or more battery packs connected in parallel; a maximum/minimum/average value detection unit configured to detect a maximum SOC value, a minimum SOC value, a maximum SOH value, a minimum SOH value, an average SOC value, and an average SOH value among the values calculated by the individual SOC value and SOH value calculation unit; a temporary SOC value and SOH value setting unit 300 configured to set a temporary SOC value and a temporary SOH value by comparing the values detected by the maximum/minimum/average value detection unit with the predetermined SOC tolerance value and SOH tolerance value of the entire battery pack system in which two or more battery packs are connected in parallel; a counting unit configured to count the number of operations of the temporary SOC value and SOH value setting unit; and a system SOC value and SOH value system changing unit configured to, if the number of operations of the temporary SOC and SOH value setting unit counted by the counting unit becomes greater than a predetermined value, change the SOC value and the SOH value of the entire battery pack system in which the battery packs are connected in parallel based on the temporary SOC value and the temporary SOH value set in the temporary SOC value and SOH value setting unit, wherein the system SOC value and SOH value changing unit further includes a difference value calculation unit for calculating a difference value between the temporary SOC value and SOH value set by the temporary SOC value and SOH value setting unit and the immediately preceding SOC value and SOH value of the entire battery pack system in which two or more battery packs are connected in parallel, wherein if the number of operations counted in the counting unit is less than a predetermined number, the SOC value and the SOH value of the entire battery pack in which two or more battery packs are connected in parallel are not changed, if the number of operations counted in the counting unit is greater than the predetermined number and a result value of the difference value calculation unit is within a predetermined range, the temporary SOC value and SOH value set in the temporary SOC value and SOH value setting unit are set as the SOC value and the SOH value of the entire battery pack system in which two or more battery packs are connected in parallel, and if the number of operations counted in the counting unit is greater than the predetermined number and the result value of the difference value calculation unit is out of the predetermined range, the current system SOC value and SOH value of the entire battery pack system in which two or more battery packs are connected in parallel are changed by a predetermined value in a direction in which the difference value is deceased, and the changed system SOC value and SOH value are set as the current system SOC value and SOH value of the entire battery pack system in which two or more battery packs are connected in parallel.

The temporary SOC value and SOH value setting unit, if the maximum SOC value and the maximum SOH value detected by the maximum/minimum/average value detection unit are greater than the SOC maximum tolerance value and the SOH maximum tolerance value of the entire battery pack system in which two or more battery pack are connected in parallel, may set the maximum SOC value and the maximum SOH value detected by the maximum/minimum/average value detection unit as a temporary SOC value and SOH value, if the maximum SOC value and the maximum SOH value detected by the maximum/minimum/average value detection unit 200 are less than or equal to the SOC maximum tolerance value and the SOH maximum tolerance value of the entire battery pack system in which two or more battery packs are connected in parallel, may compare the minimum SOC value and the minimum SOH value detected by the maximum/minimum/average value detection unit with the predetermined SOC minimum tolerance value and SOH minimum tolerance value of the entire battery pack system in which two or more battery packs are connected in parallel, if the minimum SOC value and the minimum SOH value detected by the maximum/minimum/average value detection unit are less than the predetermined SOC minimum tolerance value and SOH minimum tolerance value of the entire battery pack system in which two or more battery packs are connected in parallel, may set the minimum SOC value and the minimum SOH value detected by the maximum/minimum/average value detection unit as a temporary SOC value and SOH value, and if the minimum SOC value and the minimum SOH value detected by the maximum/minimum/average value detection unit are greater than or equal to the predetermined SOC minimum tolerance value and SOH minimum tolerance value of the entire battery pack system in which two or more battery packs are connected in parallel, may set the average SOC value and SOH value detected by the maximum/minimum/average value detection unit as a temporary SOC value and SOH value.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
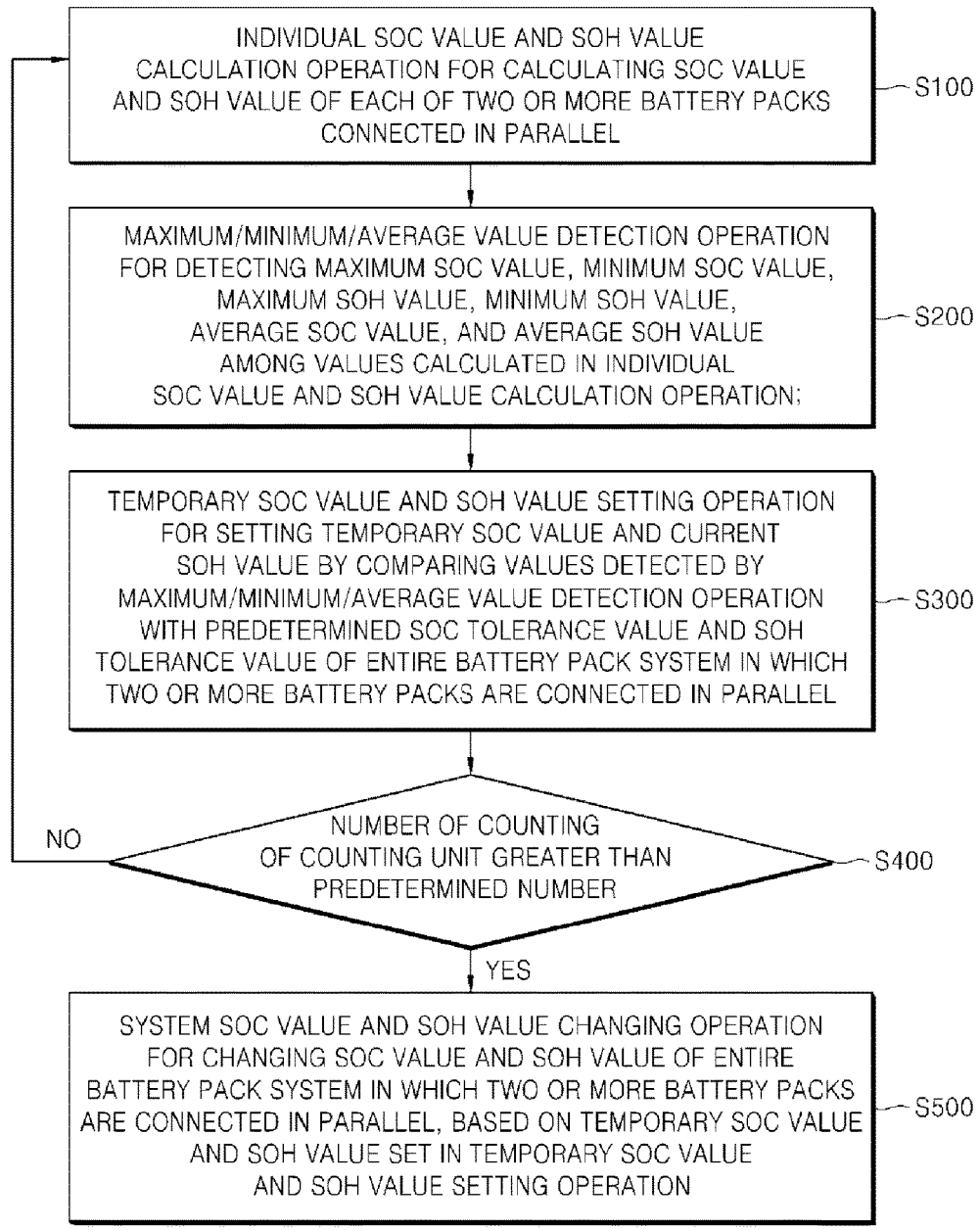
FIG. 1 is an entire flowchart according to an embodiment.
Figure 2:
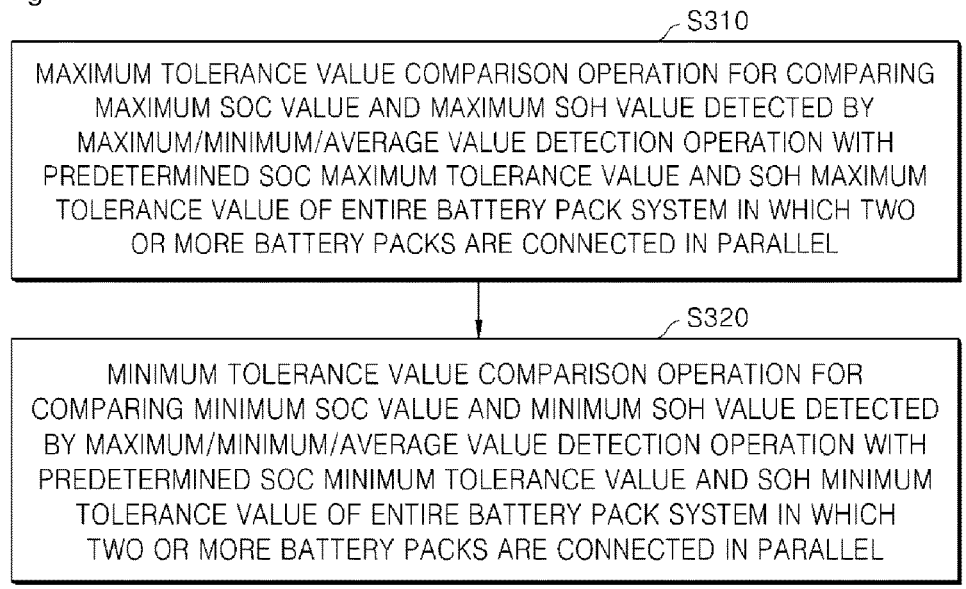
FIG. 2 is a flowchart of a temporary SOC value and SOH value setting operation according to an embodiment.
Figure 3:
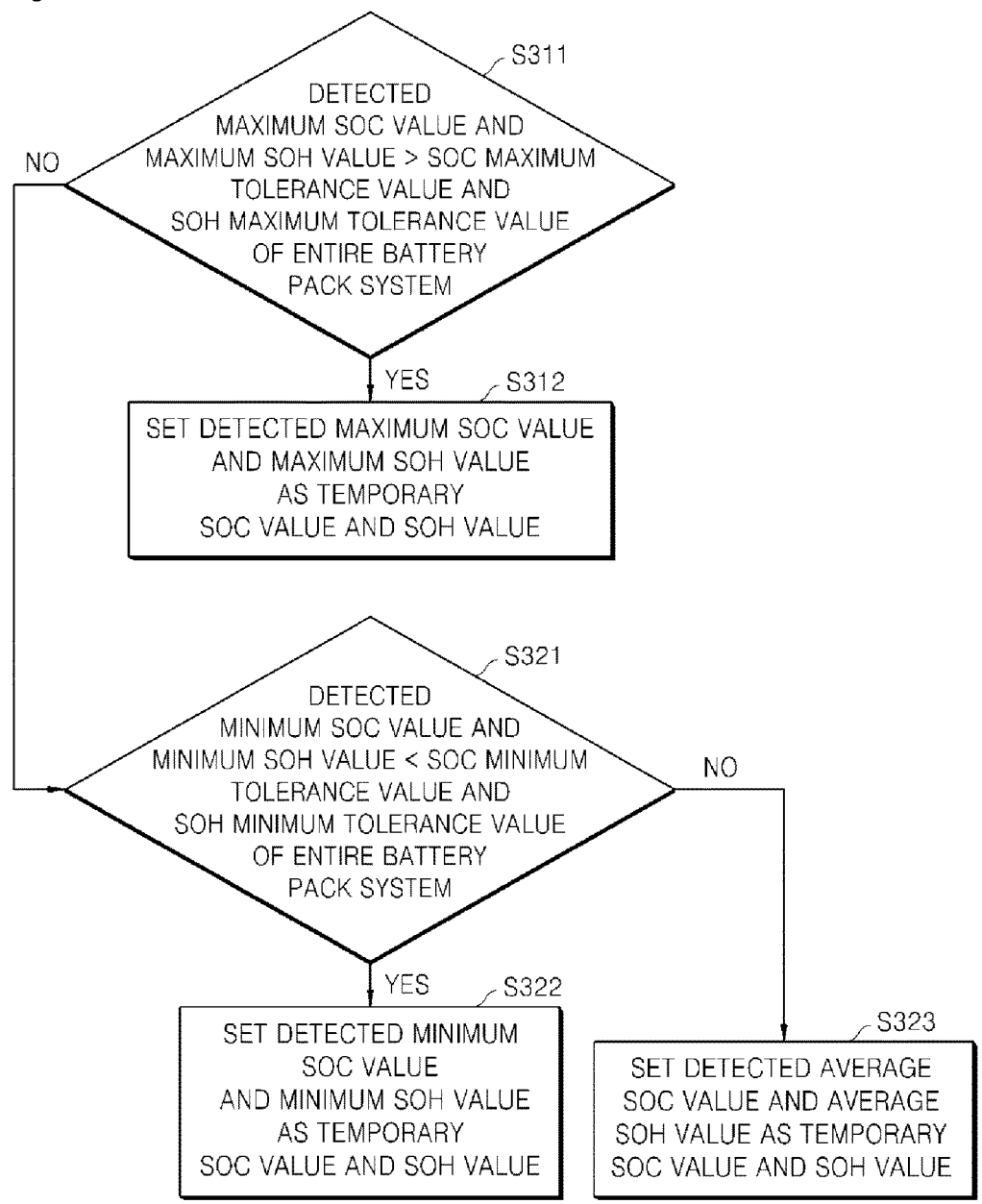
FIG. 3 is a specific flowchart of a maximum/minimum tolerance value comparison operation according to an embodiment.
Figure 4:
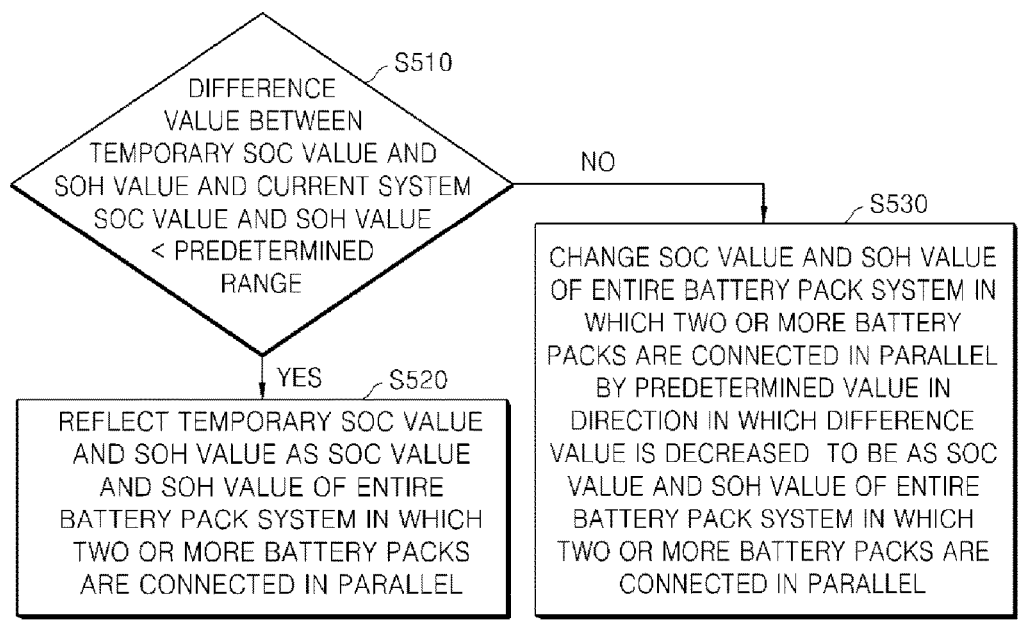
FIG. 4 is a flowchart of a system SOC value and SOH value changing operation according to an embodiment.
Figure 5:
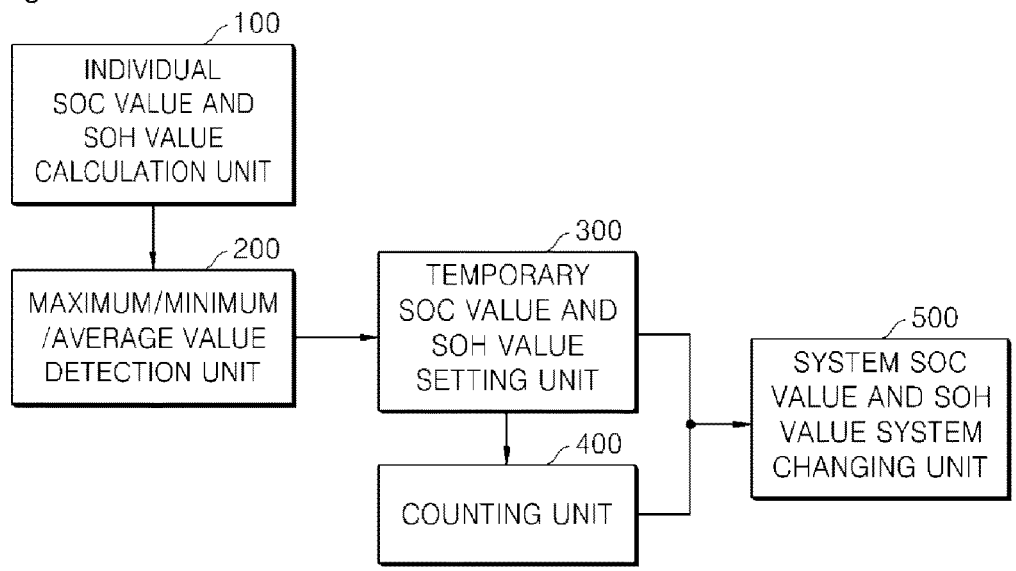
FIG. 5 is a configuration diagram according to an embodiment.

Hereinafter, exemplary embodiments of the present disclosure will be described in more detail with reference to the contents described in the accompanying drawings. However, the present disclosure is not limited or restricted to exemplary embodiments. Like reference numerals in each drawing represent members for performing the same function substantially.

Although the terms "first," "second," etc., may be used herein to describe various elements, these elements should not be limited by these terms. The above terms are used only to distinguish one component from another. For example, a first component may be referred to as a second component and vice versa without departing from the scope of the present disclosure. Terms used in this specification are used to describe specific embodiments, and are not intended to limit the scope of the present disclosure. The singular expressions include plural expressions unless the context clearly dictates otherwise.

Terms used in this specification may be currently widely used general terms in consideration of functions in the present disclosure but may vary according to the intents of those skilled in the art, precedents, or the advent of new technology. Additionally, in certain cases, there may be terms the applicant selects arbitrarily and in this case, their meanings are described in a corresponding description part of the present disclosure. Accordingly, terms used in the present disclosure should be defined based on the meaning of the term and the entire contents of the present disclosure instead of the simple term name.

When it is described in the entire specification that one part "includes" some elements, it means that the one part may include only those elements, or include other elements as well as those elements if there is no specific limitation.

1. Method for Controlling SOC Value and SOH Value of Entire Battery Pack System in which Two or More Battery Packs are Connected in Parallel The method of controlling the SOC value and the SOH value of the battery pack system in which two or more battery packs are connected in parallel according to an embodiment of the present disclosure includes an individual SOC value and SOH value calculation operation (S100) for calculating the SOC value and the SOH value of each of the two or more battery packs connected in parallel, a maximum/minimum/average value detection operation (S200) for detecting a maximum SOC value, a minimum SOC value, a maximum SOH value, a minimum SOH value, an average SOC value, and an average SOH value among the values calculated in the individual SOC value and SOH value calculation operation (S100), a temporary SOC value and SOH value setting operation (S300) for setting a temporary SOC value and a temporary SOH value by comparing the values detected by the maximum/minimum/average value detection operation (S200) with a predetermined SOC tolerance value and SOH tolerance value of the entire battery pack system in which two or more battery packs are connected in parallel, a counting operation (S400) for counting the number of times of the temporary SOC value and the SOH value setting performance period configured in the temporary SOC value and SOH value setting operation (S300), and a system SOC value and SOH value changing operation (S500) for if the number of times of the temporary SOC value and the SOH value setting performance period counted in the counting operation (S400) is greater than a predetermined value, resetting the counting number and changing the SOC value and the SOH value of the entire battery pack system in which two or more battery packs are connected in parallel, based on the value set in the temporary SOC value and SOH value setting operation (S300).

More specifically, the individual SOC value and the SOH value calculation operation (S100) may measure one or more values of the voltage, current, and OCV values of each of the battery packs, and based on this, calculate SOC and SOH values of each of the battery packs.

For example, it is possible to calculate the SOC value by accumulating the discharged current by discharging the current of the battery pack for a predetermined time, and measure the SOH value from the calculated SOC value.

Moreover, the individual SOC and SOH value calculation operation (S100) may be performed in a separate module or in a BMS provided in a battery pack or a battery pack system.

Furthermore, the maximum/minimum/average value detection operation (S200) may be an operation for detecting a maximum SOC value and a maximum SOH value, a minimum SOC value and a minimum SOH value, an average SOC value, and an average SOH value among the SOC and SOH values of the individual battery pack calculated in the individual SOC and SOH value calculation operation (S100) and temporarily storing the detected value in the memory.

Meanwhile, the temporary SOC value and SOH value setting operation S300 may be set by comparing the maximum SOC value and the maximum SOH value, the minimum SOC value and the minimum SOH value, the average SOC value, and the average SOH value detected by the maximum/minimum/average value detection operation (S200) with a tolerance value set by a user in a battery pack system in which two or more batteries are connected in parallel.

More specifically, the temporary SOC value and SOH value setting operation (S300) may include a maximum tolerance value comparison operation (S310) for comparing the maximum SOC value and the maximum SOH value detected by the maximum/minimum/average value detection operation (S200) with the predetermined SOC maximum tolerance value and SOH maximum tolerance value of the entire battery pack system in which two or more battery packs are connected in parallel, and a minimum tolerance value comparison operation (S320) for comparing the minimum SOC value and the minimum SOH value detected by the maximum/minimum/average value detection operation (S200) with the predetermined SOC minimum tolerance value and SOH minimum tolerance value of the entire battery pack system in which two or more battery packs are connected in parallel.

The maximum tolerance value comparison operation (S310) may set the maximum SOC value and the maximum SOH value detected by the maximum/minimum/average value detection operation (S200) as a temporary SOC value and SOH value (S312) if the maximum SOC value and the maximum SOH value detected by the maximum/minimum/average value detection operation (S200) are greater than the predetermined SOC maximum tolerance value and SOH maximum tolerance value of the entire battery pack system in which two or more battery packs are connected in parallel, and perform the minimum tolerance value comparison operation (S320) if the maximum SOC value and the maximum SOH value detected by the maximum/minimum/average value detection operation (S200) are less than or equal to the predetermined SOC maximum tolerance value and SOH maximum tolerance value of the entire battery pack system in which two or more battery packs are connected in parallel.

Moreover, the minimum tolerance value comparison operation (S320) may set the minimum SOC value and the minimum SOH value detected by the maximum/minimum/average value detection operation (S200) as a temporary SOC value and SOH value (S322) if the minimum SOC value and the minimum SOH value detected by the maximum/minimum/average value detection operation (S200) are less than the predetermined SOC minimum tolerance value and SOH minimum value of the entire battery pack system in which two or more battery packs are connected in parallel (S321), and may set the average SOC value and the average SOH value detected by the maximum/minimum/average value detection operation (S200) as a temporary SOC value and SOH value (S323) if the minimum SOC value and the minimum SOH value detected by the maximum/minimum/average value detection operation (S200) are greater than or equal to the predetermined SOC minimum tolerance value and SOH minimum value of the entire battery pack system in which two or more battery packs are connected in parallel.

As a specific example, if the maximum SOC and SOH values are 95, the minimum SOC and SOH values are 50, the average SOC and SOH values are 70, which are detected by the maximum/minimum/average value detection operation (S200), and if the SOC maximum tolerance value and SOH maximum tolerance value of the entire battery pack system in which two or more battery packs are connected in parallel are 90 and the SOC minimum tolerance value and the SOH minimum tolerance value are 20, a temporary SOC value and SOH value may be set to 95.

Moreover, as another embodiment, if the maximum SOC and SOH values are 87, the minimum SOC and SOH values are 50, the average SOC and SOH values are 70, which are detected by the maximum/minimum/average value detection operation (S200), and if the SOC maximum tolerance value and SOH maximum tolerance value of the entire battery pack system in which two or more battery packs are connected in parallel are 90 and the SOC minimum tolerance value and the SOH minimum tolerance value are 20, a temporary SOC value and SOH value may be set to 70.

Moreover, the system SOC value and SOH value changing operation (S500) may include if the number of temporary SOC value and the SOH value setting performance period counted in the counting operation is less than a predetermined value, an operation for returning to the individual SOC value and SOH value calculation operation (S100), and performing the temporary SOC value and SOH value setting performance period again, and a difference value calculation operation for calculating a difference value between the temporary SOC value and the temporary SOH value set in the temporary SOC value and SOH value setting operation and the current system SOC value and SOH value of the entire battery pack system in which two or more battery packs are connected in parallel.

Then, the system SOC value and SOH value changing operation (S500) may set the temporary SOC value and the temporary SOH value set in the temporary SOC value and SOH value setting operation as the SOC value and the SOH value of the entire battery pack system in which two or more battery packs are connected in parallel if the difference value calculated in the difference value calculation operation is within a predetermined range, and if the calculated difference value is a value outside the predetermined range, may change the current system SOC value and SOH value of the entire battery pack system in which two or more battery packs are connected in parallel by a predetermined value in a direction in which the difference value is deceased, and may set the changed system SOC value and SOH value as the current system SOC value and SOH value of the entire battery pack system in which two or more battery packs are connected in parallel.

As a specific embodiment, if the temporary SOC value and SOH value are set to 70, the current system SOC value and SOH value of the entire battery pack system in which two or more battery packs are connected in parallel are 65, and the predetermined range is 1, the difference value between the temporary SOC value and SOH value of the immediately preceding SOC value and SOH value setting performance period becomes 5 and thus becomes out of the predetermined range. Thus, in order to reduce the difference value, it is possible to change 66, which is a value obtained by increasing the SOC value and the SOH value of the entire battery pack system in which two or more battery packs are connected in parallel by 1, as the SOC value and the SOH value of the battery pack system in which two or more battery packs connected in parallel.

In addition, as another embodiment, if the temporary SOC value and SOH value are set to 70, the current system SOC value and SOH value of the entire battery pack system in which two or more battery packs are connected in parallel are 75, and the predetermined range is 1, the difference value between the temporary SOC value and SOH value and the temporary SOC value and SOH value of the immediately preceding SOC value and SOH value setting performance period becomes 5 and thus becomes out of the predetermined range. Thus, in order to reduce the difference value, it is possible to change 74, which is a value obtained by decreasing the SOC value and the SOH value of the entire battery pack system in which two or more battery packs are connected in parallel by 1, as the SOC value and the SOH value of the battery pack system in which two or more battery packs connected in parallel.

Meanwhile, if the temporary SOC value and SOH value are set to 70, the current system SOC value and SOH value of the entire battery pack system in which two or more battery packs are connected in parallel are 70.5, and the predetermined range is 1, the difference value between the temporary SOC value and the SOH value and the temporary SOC value and SOH value of the immediately preceding temporary SOC value and SOH value setting performance period becomes 0.5, and thus becomes within a predetermined range. Therefore, it is possible to change 70, which is the temporary SOC value and the SOH value, to the SOC value and the SOH value of the battery pack system in which two or more battery packs are connected in parallel.

2. Device for Controlling SOC Value and SOH Value of Entire Battery Pack System in which Two or More Battery Packs are Connected in Parallel A device for controlling an SOC value and an SOH value of a battery pack system in which two or more battery packs are connected in parallel, according to an embodiment of the present disclosure, includes an individual SOC value and SOH value calculation unit 100 for calculating the SOC value and the SOH value of each of two or more battery packs connected in parallel, a maximum/minimum/average value detection unit 200 for detecting the maximum SOC value, the minimum SOC value, the maximum SOH value, the minimum SOH value, the average SOC value, and the average SOH value among the values calculated by the individual SOC value and SOH value calculation unit 100, a temporary SOC value and SOH value setting unit 300 for setting the temporary SOC value and SOH value by comparing the values detected by the maximum/minimum/average value detection unit 200 with the predetermined SOC tolerance value and SOH tolerance value of the battery pack system in which two or more battery packs are connected in parallel, a counting unit 400 for counting the number of operations of the temporary SOC value and SOH value setting unit 300, and a system SOC value and SOH value system changing unit 500 for, if the number of operations of the temporary SOC and SOH value setting unit counted by the counting unit 400 becomes equal to or greater than a predetermined value, changing the SOC value and the SOH value of the entire battery pack system in which the battery packs are connected in parallel based on the temporary SOC and SOH values set in the temporary SOC value and SOH value setting unit 300.

More specifically, the temporary SOC value and SOH value setting unit 300, if the maximum SOC value and the maximum SOH value detected by the maximum/minimum/average value detection unit 200 are greater than the SOC maximum tolerance value and the SOH maximum tolerance value of the entire battery pack system in which two or more battery pack are connected in parallel, sets the maximum SOC value and the maximum SOH value detected by the maximum/minimum/average value detection unit 200 as a temporary SOC value and SOH value, and if the maximum SOC value and the maximum SOH value detected by the maximum/minimum/average value detection unit 200 are less than or equal to the SOC maximum tolerance value and the SOH maximum tolerance value of the entire battery pack system in which two or more battery packs are connected in parallel, compares the minimum SOC value and the minimum SOH value detected by the maximum/minimum/average value detection unit 200 with the predetermined SOC minimum tolerance value and SOH minimum tolerance value of the entire battery pack system in which two or more battery packs are connected in parallel, and if the minimum SOC value and the minimum SOH value detected by the maximum/minimum/average value detection unit 200 are less than the predetermined SOC minimum tolerance value and SOH minimum tolerance value of the entire battery pack system in which two or more battery packs are connected in parallel, sets the minimum SOC value and the minimum SOH value detected by the maximum/minimum/average value detection unit 200 as a temporary SOC value and SOH value, and if the minimum SOC value and the minimum SOH value detected by the maximum/minimum/average value detection unit 200 are greater than or equal to the predetermined SOC minimum tolerance value and SOH minimum tolerance value of the entire battery pack system in which two or more battery packs are connected in parallel, set the average SOC value and SOH value detected by the maximum/minimum/average value detection unit 200 as a temporary SOC value and SOH value.

Meanwhile, the system SOC value and SOH value changing unit 500 may further include a difference value calculation unit (not shown) for calculating a difference value between the temporary SOC value and SOH value set by the temporary SOC value and SOH value setting unit 300 and the SOC value and the SOH value of the entire battery pack system in which two or more battery packs are connected in parallel.

Then, the system SOC value and SOH value changing unit 500 may change the SOC value and the SOH value of the entire battery pack system in which two or more battery packs are connected in parallel with the temporary SOC value and SOH value set in the temporary SOC value and SOH value setting unit if the result value of the difference value calculation unit is within a predetermined range, and if the result value of the difference value calculation unit is out of the predetermined range, may change the current system SOC value and SOH value of the entire battery pack system in which two or more battery packs are connected in parallel by a predetermined value in a direction in which the difference value is deceased, and may set the changed system SOC value and SOH value as the current system SOC value and SOH value of the entire battery pack system in which two or more battery packs are connected in parallel.

The present disclosure may control SOC and SOH of a battery pack system in which two or more battery packs are connected in parallel.

More specifically, the present disclosure measures the SOC and SOH of each battery pack and setting it to a relaxed value in the entire battery pack system in order to prevent sudden changes in SOC and SOH values of the battery pack system and allow the battery pack system to be used within a safe range.

Although the device and method for controlling the SOC and SOH of an entire battery pack system in which two or more battery packs are connected in parallel (have been described with reference to the specific embodiments, they are not limited thereto. Therefore, it will be readily understood by those skilled in the art that various modifications and changes can be made thereto without departing from the spirit and scope of the present disclosure defined by the appended claims.

What is claimed is:

1. A method of controlling an SOC value and an SOH value of an entire battery pack system in which two or more battery packs are connected in parallel, the method comprising:
    an individual SOC value and SOH value calculation operation for calculating the SOC value and the SOH value of each of the two or more battery packs connected in parallel;
    a maximum/minimum/average value detection operation for detecting a maximum SOC value, a minimum SOC value, a maximum SOH value, a minimum SOH value, an average SOC value, and an average SOH value among the values calculated in the individual SOC value and SOH value calculation operation;
    a temporary SOC value and SOH value setting operation for setting a temporary SOC value and a temporary SOH value by comparing the values detected by the maximum/minimum/average value detection operation with a predetermined SOC tolerance value and SOH tolerance value of the entire battery pack system in which two or more battery packs are connected in parallel;
    a counting operation for counting the number of times of the temporary SOC value and the SOH value setting performance period configured in the temporary SOC value and SOH value setting operation; and
    a system SOC value and SOH value changing operation for if the number of times of the temporary SOC value and the SOH value setting performance period counted in the counting operation is greater than a predetermined value, resetting the counting number and changing the SOC value and the SOH value of the entire battery pack system in which two or more battery packs are connected in parallel, based on the temporary SOC value and SOH value set in the temporary SOC value and SOH value setting operation,
    wherein the system SOC value and SOH value changing operation further comprises, if the number of temporary SOC value and the SOH value setting performance period counted in the counting operation is less than a predetermined value, an operation for returning to the individual SOC value and SOH value calculation operation and performing the temporary SOC value and SOH value setting performance period again; and
    a difference value calculation operation for calculating a difference value between the temporary SOC value and the temporary SOH value set in the temporary SOC value and SOH value setting operation and the current system SOC value and SOH value of the entire battery pack system in which two or more battery packs are connected in parallel,
    wherein if the difference value calculated in the difference value calculation operation is within a predetermined range, the temporary SOC value and the temporary SOH value set in the temporary SOC value and SOH value setting operation are set as the SOC value and the SOH value of the entire battery pack system in which two or more battery packs are connected in parallel; and
    if the calculated difference value is out of the predetermined range, the current system SOC value and SOH value of the entire battery pack system in which two or more battery packs are connected in parallel are changed by a predetermined value in a direction in which the difference value is deceased, and the changed system SOC value and SOH value are set as the current system SOC value and SOH value of the entire battery pack system in which two or more battery packs are connected in parallel.

2. The method of claim 1, wherein the temporary SOC value and SOH value setting operation comprises:
    a maximum tolerance value comparison operation for comparing the maximum SOC value and the maximum SOH value detected by the maximum/minimum/average value detection operation with the predetermined SOC maximum tolerance value and SOH maximum tolerance value of the entire battery pack system in which two or more battery packs are connected in parallel; and
    a minimum tolerance value comparison operation for comparing the minimum SOC value and the minimum SOH value detected by the maximum/minimum/average value detection operation with the predetermined SOC minimum tolerance value and SOH minimum tolerance value of the entire battery pack system in which two or more battery packs are connected in parallel.

3. The method of claim 2, wherein
    the maximum tolerance value comparison operation sets the maximum SOC value and the maximum SOH value detected by the maximum/minimum/average value detection operation as a temporary SOC value and a temporary SOH value if the maximum SOC value and the maximum SOH value detected by the maximum/minimum/average value detection operation are greater than the predetermined SOC maximum tolerance value and SOH maximum tolerance value of the entire battery pack system in which two or more battery packs are connected in parallel, and
    performs the minimum tolerance value comparison operation if the maximum SOC value and the maximum SOH value detected by the maximum/minimum/average value detection operation are less than the predetermined SOC maximum tolerance value and SOH maximum tolerance value of the entire battery pack system in which two or more battery packs are connected in parallel.

4. The method of claim 2, wherein the minimum tolerance value comparison operation sets the minimum SOC value and the minimum SOH value detected by the maximum/minimum/average value detection operation as a temporary SOC value and a temporary SOH value if the minimum SOC value and the minimum SOH value detected by the maximum/minimum/average value detection operation are less than the predetermined SOC minimum tolerance value and SOH minimum value of the entire battery pack system in which two or more battery packs are connected in parallel, and sets the average SOC value and the average SOH value detected by the maximum/minimum/average value detection operation as a temporary SOC value and a temporary SOH value if the minimum SOC value and the minimum SOH value detected by the maximum/minimum/average value detection operation are greater than the predetermined SOC minimum tolerance value and SOH minimum value of the entire battery pack system in which two or more battery packs are connected in parallel.

5. A device for controlling an SOC value and an SOH value of an entire battery pack system in which two or more battery packs are connected in parallel, the device comprising:

an individual SOC value and SOH value calculation unit configured to calculate an SOC value and an SOH value of each of two or more battery packs connected in parallel;

a maximum/minimum/average value detection unit configured to detect a maximum SOC value, a minimum SOC value, a maximum SOH value, a minimum SOH value, an average SOC value, and an average SOH value among the values calculated by the individual SOC value and SOH value calculation unit;

a temporary SOC value and SOH value setting unit 300 configured to set a temporary SOC value and a temporary SOH value by comparing the values detected by the maximum/minimum/average value detection unit with the predetermined SOC tolerance value and SOH tolerance value of the entire battery pack system in which two or more battery packs are connected in parallel;

a counting unit configured to count the number of operations of the temporary SOC value and SOH value setting unit; and a system SOC value and SOH value system changing unit configured to, if the number of operations of the temporary SOC and SOH value setting unit counted by the counting unit becomes greater than a predetermined value, change the SOC value and the SOH value of the entire battery pack system in which the battery packs are connected in parallel based on the temporary SOC value and the temporary SOH value set in the temporary SOC value and SOH value setting unit, wherein the system SOC value and SOH value changing unit further comprises a difference value calculation unit for calculating a difference value between the temporary SOC value and SOH value set by the temporary SOC value and SOH value setting unit and the immediately preceding SOC value and SOH value of the entire battery pack system in which two or more battery packs are connected in parallel, wherein if the number of operations counted in the counting unit is less than a predetermined number, the SOC value and the SOH value of the entire battery pack in which two or more battery packs are connected in parallel are not changed, if the number of operations counted in the counting unit is greater than the predetermined number and a result value of the difference value calculation unit is within a predetermined range, the temporary SOC value and SOH value set in the temporary SOC value and SOH value setting unit are set as the SOC value and the SOH value of the entire battery pack system in which two or more battery packs are connected in parallel, and if the number of operations counted in the counting unit is greater than the predetermined number and the result value of the difference value calculation unit is out of the predetermined range, the current system SOC value and SOH value of the entire battery pack system in which two or more battery packs are connected in parallel are changed by a predetermined value in a direction in which the difference value is deceased, and the changed system SOC value and SOH value are set as the current system SOC value and SOH value of the entire battery pack system in which two or more battery packs are connected in parallel.

6. The device of claim 5, wherein the temporary SOC value and SOH value setting unit, if the maximum SOC value and the maximum SOH value detected by the maximum/minimum/average value detection unit are greater than the SOC maximum tolerance value and the SOH maximum tolerance value of the entire battery pack system in which two or more battery pack are connected in parallel, sets the maximum SOC value and the maximum SOH value detected by the maximum/minimum/average value detection unit as a temporary SOC value and SOH value, if the maximum SOC value and the maximum SOH value detected by the maximum/minimum/average value detection unit 200 are less than or equal to the SOC maximum tolerance value and the SOH maximum tolerance value of the entire battery pack system in which two or more battery packs are connected in parallel, compares the minimum SOC value and the minimum SOH value detected by the maximum/minimum/average value detection unit with the predetermined SOC minimum tolerance value and SOH minimum tolerance value of the entire battery pack system in which two or more battery packs are connected in parallel, if the minimum SOC value and the minimum SOH value detected by the maximum/minimum/average value detection unit are less than the predetermined SOC minimum tolerance value and SOH minimum tolerance value of the entire battery pack system in which two or more battery packs are connected in parallel, sets the minimum SOC value and the minimum SOH value detected by the maximum/minimum/average value detection unit as a temporary SOC value and SOH value, and if the minimum SOC value and the minimum SOH value detected by the maximum/minimum/average value detection unit are greater than or equal to the predetermined SOC minimum tolerance value and SOH minimum tolerance value of the entire battery pack system in which two or more battery packs are connected in parallel, sets the average SOC value and SOH value detected by the maximum/minimum/average value detection unit as a temporary SOC value and SOH value.

* * * * *